United States Patent
Wang et al.

(10) Patent No.: US 7,344,905 B2
(45) Date of Patent: Mar. 18, 2008

(54) SPATIAL BANDGAP MODIFICATIONS AND ENERGY SHIFT OF SEMICONDUCTOR STRUCTURES

(75) Inventors: Peidong Wang, Carlisle, MA (US); Chih-Cheng Lu, Bedford, MA (US); Daryoosh Vakhshoori, Cambridge, MA (US)

(73) Assignee: Ahura Corporation, Wilmington, MA (US)

( * ) Notice: Subject to any disclaimer, the term of this patent is extended or adjusted under 35 U.S.C. 154(b) by 138 days.

(21) Appl. No.: 10/824,838

(22) Filed: Apr. 15, 2004

(65) Prior Publication Data

US 2005/0238073 A1 Oct. 27, 2005

Related U.S. Application Data

(60) Provisional application No. 60/462,888, filed on Apr. 15, 2003.

(51) Int. Cl.
*H01L 21/00* (2006.01)

(52) U.S. Cl. .......................................... 438/35; 438/36

(58) Field of Classification Search ............... 438/35, 438/36
See application file for complete search history.

(56) References Cited

U.S. PATENT DOCUMENTS 6,027,989 A * 2/2000 Poole et al. ................. 438/522
7,068,905 B2 6/2006 Vakhshoori et al.
2003/0053789 A1* 3/2003 Marsh et al. ................ 385/141
2005/0153473 A1* 7/2005 Teng et al. .................... 438/47

* cited by examiner

*Primary Examiner*—B. William Baumeister
*Assistant Examiner*—Matthew L. Reames
(74) *Attorney, Agent, or Firm*—Fish & Richardson P.C.

(57) ABSTRACT

Semiconductor substrate is disclosed having quantum wells having first bandgap, and quantum wells having second bandgap less than second bandgap. Semiconductor structure is disclosed comprising substrate having quantum wells having given bandgap, other quantum wells modified to bandgap greater than given bandgap. Semiconductor substrate is disclosed comprising wafer having quantum wells, section of first bandgap, and section of second bandgap greater than first bandgap. Method for forming semiconductor substrate is provided, comprising providing wafer having given bandgap, depositing dielectric cap on portion and rapid thermal annealing to tuned bandgap greater than given bandgap. Semiconductor structure is disclosed comprising substrate having quantum wells modified by depositing cap and rapid thermal annealing to tuned bandgap greater than given bandgap. Method for forming semiconductor substrate is disclosed, comprising providing wafer having quantum wells having given bandgap, depositing cap on portion and rapid thermal annealing to tuned bandgap greater than given bandgap.

6 Claims, 8 Drawing Sheets

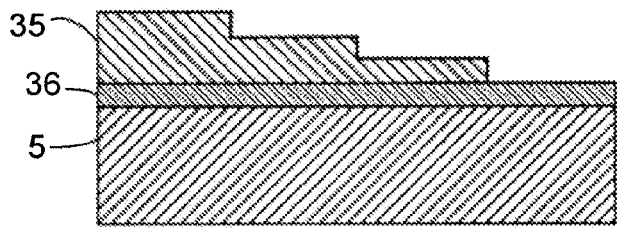
A) PATTERNING OF THE AS-GROWN WAFER
FIG. 3A
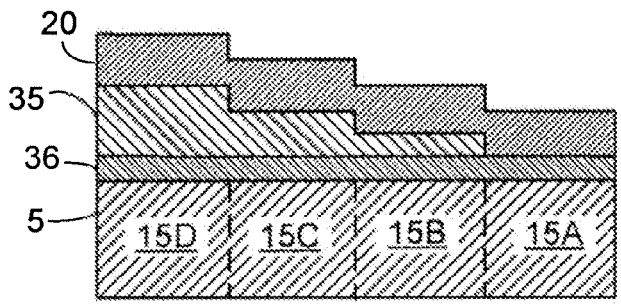
B) PATTERNING OF THE AS-GROWN WAFER, DIELECTRIC CAP DEPOSITION AND RTA
FIG. 3B
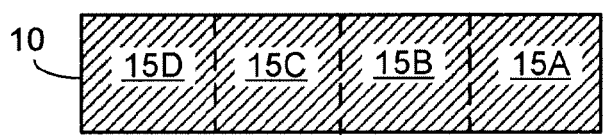
C) REMOVE ALL SACRIFICIAL LAYERS FOR FURTHER PROCESSING OF THE DEVICE WAFER
FIG. 3C
 DEVICE WAFER    SACRIFICIAL LAYER    ETCH STOP    DIELECTRIC CAP

A) PATTERNING OF VARYING IMPLANTATION MASK

B) PATTERNING OF THE AS-GROWN WAFER, DIELECTRIC CAP DEPOSITION AND RTA

C) SPATIALLY VARIED IMPLANTATION DAMAGE THAT WOULD LEAD TO VARYING DEGREE OF DISORDERING AFTER RTA STEP

SPATIAL BANDGAP MODIFICATIONS AND ENERGY SHIFT OF SEMICONDUCTOR STRUCTURES

REFERENCE TO PENDING PRIOR PATENT APPLICATION

This patent application claims benefit of pending prior U.S. Provisional Patent Application Ser. No. 60/462,888, filed Apr. 15, 2003 by Peidong Wang et al. for SPATIAL BANDGAP MODIFICATIONS AND ENERGY SHIFT OF SEMICONDUCTOR STRUCTURES, which patent application is hereby incorporated herein by reference.

FIELD OF THE INVENTION

This invention relates to optical components in general, and more particularly to optical components for generating light.

BACKGROUND OF THE INVENTION

In many applications it may be necessary and/or desirable to generate light.

Different optical components are well known in the art for generating light. By way of example but not limitation, semiconductor lasers, such as vertical cavity surface emitting lasers (VCSEL's), are well known in the art for generating light. Depending on the particular construction used, the light source may emit light across different portions of the wavelength spectrum. By way of example, many semiconductor-based light sources emit light across a relatively narrow portion of the wavelength spectrum. However, in many applications it may be necessary and/or desirable to provide a semiconductor light source which emits light across a relatively broad band of wavelengths.

The present invention is directed to a novel semiconductor light source for emitting light across an extended optical bandwidth.

SUMMARY OF THE INVENTION

An object of the invention is to provide a monolithically integrated semiconductor device having discrete sections of quantum wells with a different bandgap at each section.

Another object of the invention is to provide a monolithically integrated semiconductor device having discrete sections of quantum wells with a different bandgap at each section and means to individually excite each section so as to tune the spectral output from the semiconductor device.

A further object of the invention is to provide a monolithically integrated semiconductor device having discrete sections of quantum wells with a different bandgap shift at each section and multiple laser sources formed by each of the sections, respectively.

A still further object of the invention is to provide a method for forming a monolithically integrated semiconductor substrate having discrete sections of quantum wells with a different bandgap shift at each section.

With the above and other objects in view, as will hereinafter appear, there is provided a semiconductor substrate having a given horizontal cross-section, a first region defined in a first portion of the given horizontal cross-section of the substrate, and a second region defined in a second portion of the given horizontal cross-section of the substrate, the second region adjacent to and integral with the first region, a first given plurality of quantum wells formed in the first region, the first given plurality of quantum wells having a first given bandgap, and a second given plurality of quantum wells formed in the second region, the second given plurality of quantum wells having a second given bandgap, wherein the first given bandgap is less than the second given bandgap.

In accordance with a further feature of the invention, there is provided a semiconductor structure comprising:

a semiconductor substrate having a given horizontal cross-section, a first section defined in one portion of the given horizontal cross-section of the substrate, and a second section defined in another portion of the given horizontal cross-section of the substrate;

a first plurality of quantum wells formed in the first section, the first plurality of quantum wells having a given bandgap;

a second plurality of quantum wells formed in the second section, the second plurality of quantum wells modified by depositing a dielectric cap on the second section, and rapid thermal annealing of the dielectric cap for a given time and at a given temperature, so as to tune the second plurality of quantum wells to a tuned bandgap;

wherein the tuned bandgap is greater than the given bandgap.

In accordance with a further feature of the invention, there is provided a semiconductor substrate comprising:

a single semiconductor wafer having a first end and a second end in opposition to one another, and a longitudinal axis formed between the first end and the second end;

a plurality of quantum wells formed in the single semiconductor wafer between the first end and the second end, a first section of the plurality of quantum wells having a first given bandgap, and a second section of the plurality of quantum wells having a second given bandgap;

wherein the second given bandgap is greater than the first given bandgap.

In accordance with a still further feature of the invention, there is provided a method for forming a semiconductor substrate, the method comprising:

providing a single semiconductor wafer having a first end and a second end in opposition to one another, a longitudinal axis formed between the first end and the second end, a top surface and a bottom surface in opposition to one another, a plurality of quantum wells disposed in the semiconductor wafer, and the plurality of quantum wells having a given bandgap;

depositing a first dielectric cap on a first given portion of the top surface of the single semiconductor wafer; and rapid thermal annealing of the first dielectric cap deposited on the top surface of the single semiconductor wafer to tune the plurality of quantum wells disposed beneath the first dielectric cap from the given bandgap to a first tuned bandgap;

wherein the first tuned bandgap is greater than the given bandgap.

In accordance with a still further feature of the invention, there is provided an semiconductor structure comprising:

a semiconductor substrate having a given horizontal cross-section, a first section defined in one portion of the given horizontal cross-section of the substrate, and a second section defined in another portion of the given horizontal cross-section of the substrate;

a first plurality of quantum wells formed in the first section, the first plurality of quantum wells having a given bandgap;

a second plurality of quantum wells formed in the second section, the second plurality of quantum wells modified by depositing a cap on the second section, and rapid thermal annealing of the cap for a given time and at a given temperature, so as to tune the second plurality of quantum wells to a tuned bandgap;

wherein the tuned bandgap is greater than the given bandgap.

In accordance with a still further feature of the invention, there is provided a method for forming a semiconductor substrate, the method comprising:

providing a single semiconductor wafer having a first end and a second end in opposition to one another, a longitudinal axis formed between the first end and the second end, a top surface and a bottom surface in opposition to one another, a plurality of quantum wells disposed in the semiconductor wafer, and the plurality of quantum wells having a given bandgap;

depositing a first cap on a first given portion of the top surface of the single semiconductor wafer; and rapid thermal annealing of the first cap deposited on the top surface of the single semiconductor material to tune the plurality of quantum wells disposed beneath the first cap from the given bandgap to a first tuned bandgap;

wherein the first tuned bandgap is greater than the given bandgap.

The above and other features of the invention, including various novel details of construction and combinations of parts and method steps, will now be more particularly described with reference to the accompanying drawings and pointed out in the claims. It will be understood that the particular devices and method steps embodying the invention are shown by way of illustration only and not as limitations of the invention. The principles and features of this invention may be employed in various and numerous embodiments without departing from the scope of the invention.

BRIEF DESCRIPTION OF THE DRAWINGS

These and other objects and features of the present invention will be more fully disclosed or rendered obvious by the following detailed description of the preferred embodiments of the invention, which are to be considered together with the accompanying drawings wherein like numbers refer to like parts, and further wherein:

FIGS. 3A-3C are schematic diagrams of a preferred embodiment of the novel bandgap modification process of the present invention in which there is shown a set of steps for adjusting the spatial bandgap shift of the silicon wafer by providing a stepped sacrificial layer between the silicon wafer and the dielectric cap;

DETAILED DESCRIPTION OF THE PREFERRED EMBODIMENTS

The present invention involves a modification of bandgap structures and energy shift of semiconductor materials spatially (in a linear dimension or two dimensions) through masking, potential implantation, and subsequent thermal processes. Semiconductor intermixing is used to cause bandgap shifting. By varying the bandgap energy at multiple sections of a single wafer through this process, a variety of semiconductor devices can be monolithically integrated on a single wafer.

Figure 1:
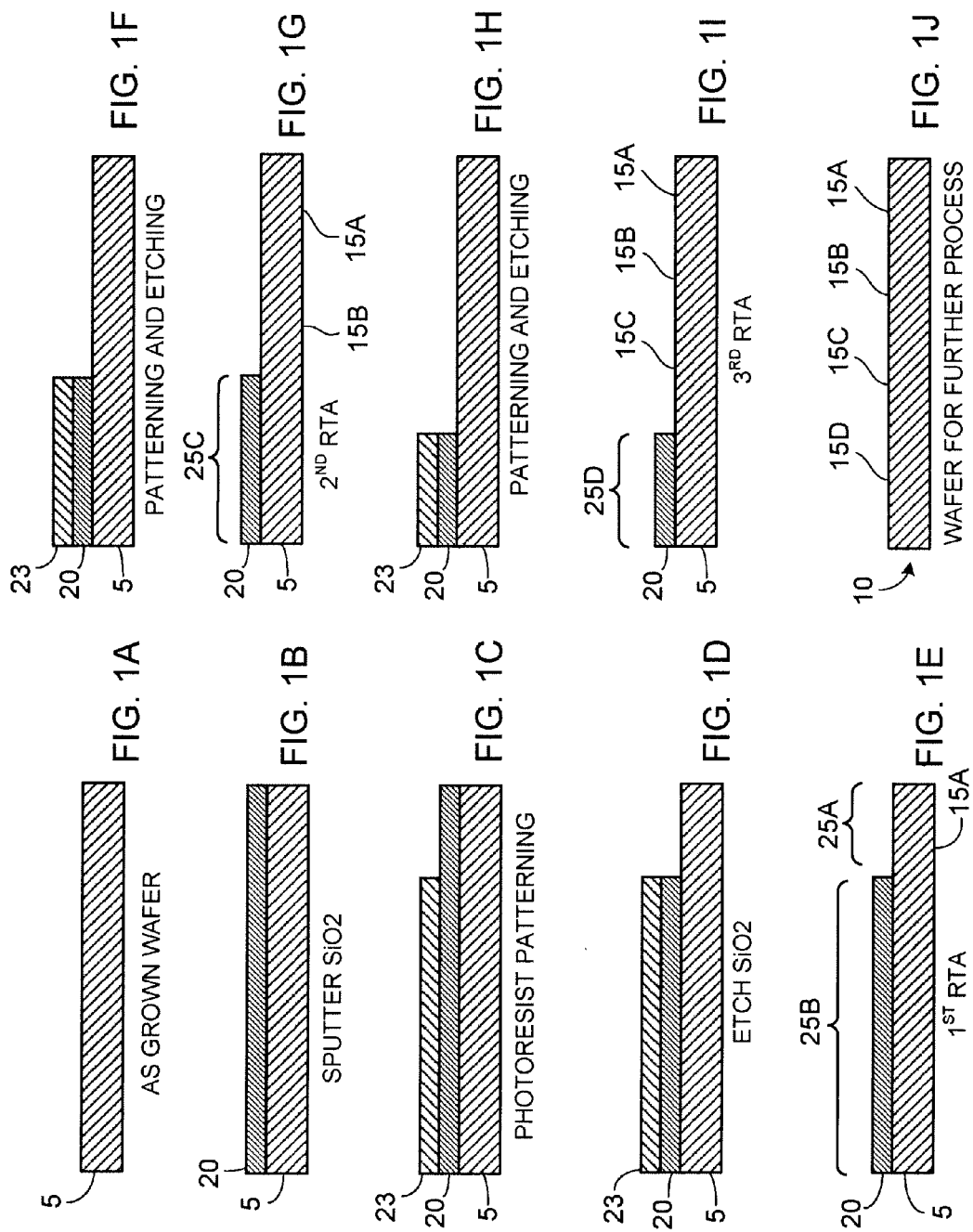
FIGS. 1A-1J are schematic diagrams of a preferred embodiment of the novel bandgap modification process of the present invention in which there is shown a set of iterative steps including rapid thermal annealing to form a silicon wafer having four discrete sections of quantum wells with a different bandgap shift at each section.

Looking first at FIGS. 1A-1J, there is shown one preferred embodiment of the present invention. More particularly, in FIGS. 1A-1J there is shown a series of steps to tune quantum wells within a single semiconductor wafer 5 so as to form an implantation free semiconductor wafer 10 (FIG. 1J) having four sections 15A, 15B, 15C, 15D of quantum wells with differing bandgaps at each of sections 15A, 15B, 15C, 15D, respectively. This process involves deposition of a dielectric cap 20, such as $SiO_2$, $TiO_2$, $Si_3N_4$, $Ta_2O_5$, or a B, P doped glass, on semiconductor wafer 5 (comprising the quantum wells to be tuned) through electron beam sputtering (e-beam) or ion beam sputtering (ion-beam). SiO2 dielectric cap 20 is patterned selectively through photolithography using a photoresist 23 so as to form an uncapped region 25A and a capped region 25B (FIGS. 1C-1E). Semiconductor wafer 5 is next subjected to rapid thermal annealing (RTA) at a specified time and a specified temperature so as to tune the bandgap of the quantum wells beneath capped region 25B (FIG. 1E). Preferably, the specified temperature is between about 600° C. and about 900° C. Alternatively, the specified temperature is above 900° C. An uncapped region 25A of semiconductor 5 has less surface modifications than capped region 25B of semiconductor 5 and hence uncapped region 25A has less bandgap tuning. This process is preferably iterated several times with smaller capped regions 25C and 25D (FIGS. 1F, 1G, 1H, and 1I) so as to achieve sections 15A, 15B, 15C, 15D, each having different bandgap tuning. Inasmuch as there is demonstrated a four section process, the same process can be extended to more than four sections.

Figure 2:
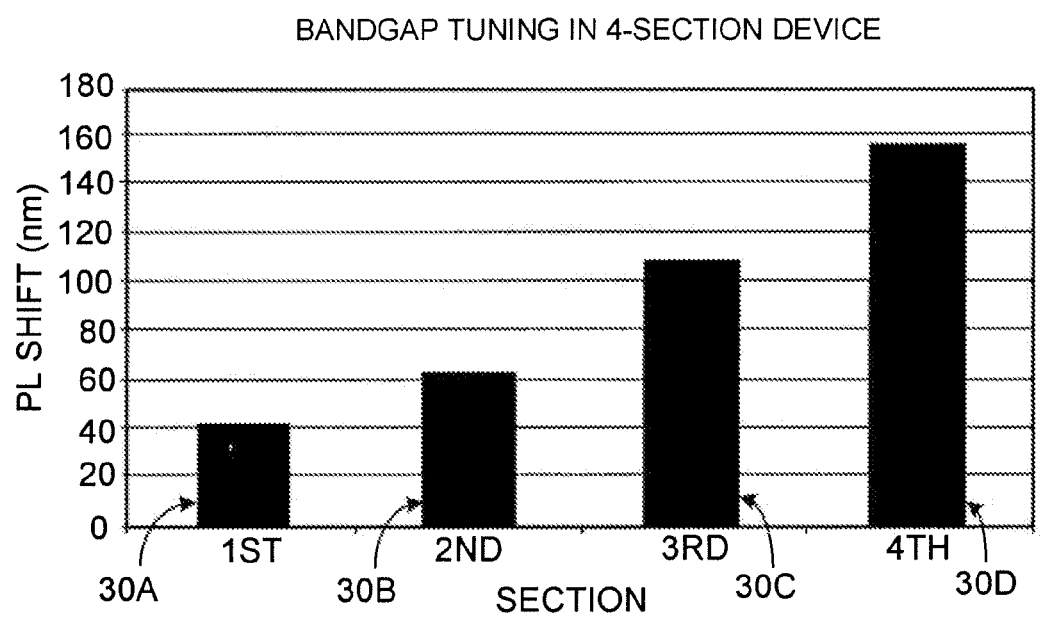
FIG. 2 is a graphical diagram in which there is shown the bandgap tuning and photoluminescence shift for each of the sections of the silicon water shown in FIGS. 1A-1J.

Referring now to FIG. 2, there is shown a graph of a photoluminescence shift 30A, 30B, 30C, 30D induced at each of the four sections 15A, 15B, 15C, 15D through the bandgap tuning of the present invention.

In another preferred embodiment of the present invention (not shown), an implantation free semiconductor wafer is formed using a reverse process of the previous technique.

More particularly, with this form of the invention, locally different patterns of dielectric films that shift the bandgap upon rapid thermal annealing (RTA) are progressively lifted off after each step of rapid thermal annealing (RTA), whereby to provide the various sections of distinct bandgap shifting.

Referring now to FIGS. 3A-3C there is shown another preferred embodiment of the present invention. More particularly, in FIGS. 3A-3C, there is shown a novel bandgap modification process in which the spatial bandgap shift of semiconductor 5 (comprising the quantum wells to be bandgap-shifted) is adjusted for sections 15A, 15B, 15C, 15D by designing, depositing, or etching a sacrificial layer 35, using an etch stop 36, so as to properly configure dielectric cap 20. The configuration of sacrificial layer 35 is preferably stepped (FIGS. 3A and 3B) or so as to yield discrete bandgap-shifted sections 15A, 15B, 15C, 15D (FIG. 3C). However, other configurations may be used. Sacrificial layer 35 includes one or more semiconductor, dielectric, or metal layers. By varying the thickness of sacrificial layer 35 above the quantum wells, different bandgap shifts will occur in each of sections 15A, 15B, 15C, 15D, respectively, after the step of rapid thermal annealing (RTA). Semiconductor wafer 5 can further be processed after removing these sacrificial layers 35.

Figure 4:
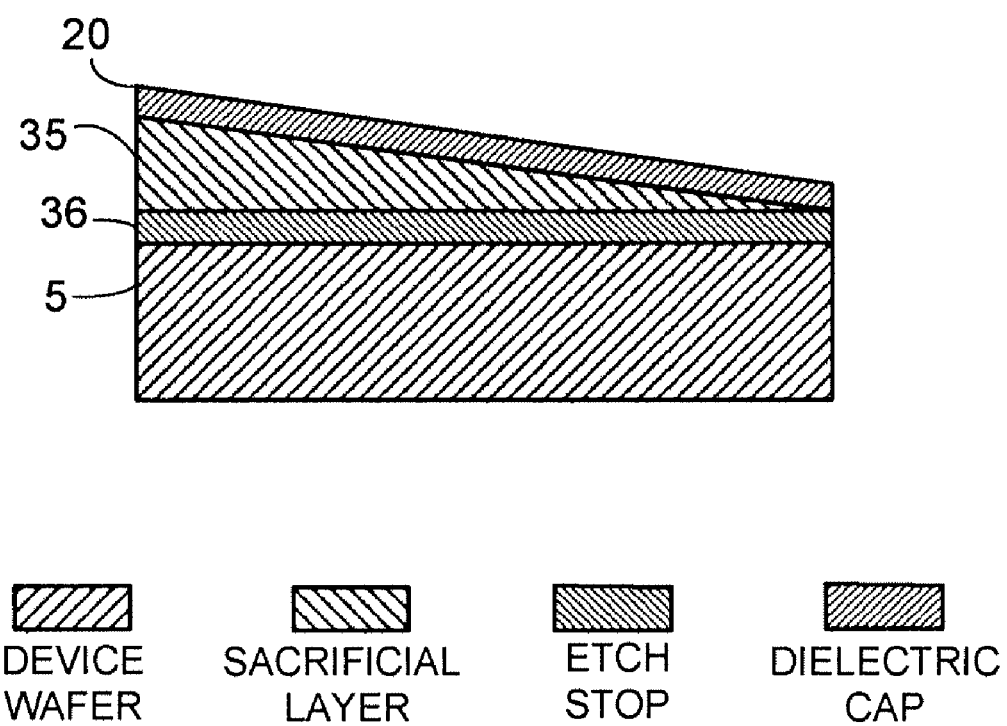
FIG. 4 is a schematic diagram of a preferred embodiment of the novel bandgap modification process of the present invention in which there is shown a graded sacrificial layer between the silicon wafer and the dielectric cap in place of the stepped sacrificial layer as shown in FIGS. 3A-3C.

Referring now to FIG. 4, there is shown another preferred embodiment of the present invention. More particularly, in FIG. 4, smooth or graded sacrificial top cladding layers 35 are deposited above etch stop 36 to appropriately pattern dielectric cap 20. Sacrificial top cladding layers 35 are created using one or more techniques. These techniques include, but are not limited to, gray scale masking and dry etching techniques. Another way to achieve graded sacrificial top cladding 35 is to pattern variable widths of photoresist along the waveguide. The photoresists are then reflowed in an oven to form the desired thickness gradient. Using dry etching, the thickness gradient is transferred to sacrificial top cladding layers 35. Dielectric cap 20 is then deposited on sacrificial top cladding layer 35 for the step of the rapid thermal annealing (RTA) process. The other portions of the process may be the same as described hereinabove.

Figure 5A:
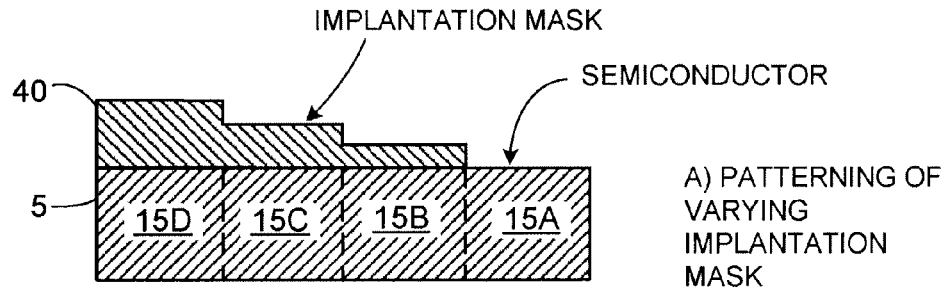
FIGS. 5A-5C are schematic diagrams of a preferred embodiment of the novel bandgap modification process of the present invention in which ion implantation together with an implantation mask is used to supplement the rapid thermal annealing of the silicon wafer as shown in FIGS. 1A-1J, 2, 3A-3C and 4.
Figure 5B:
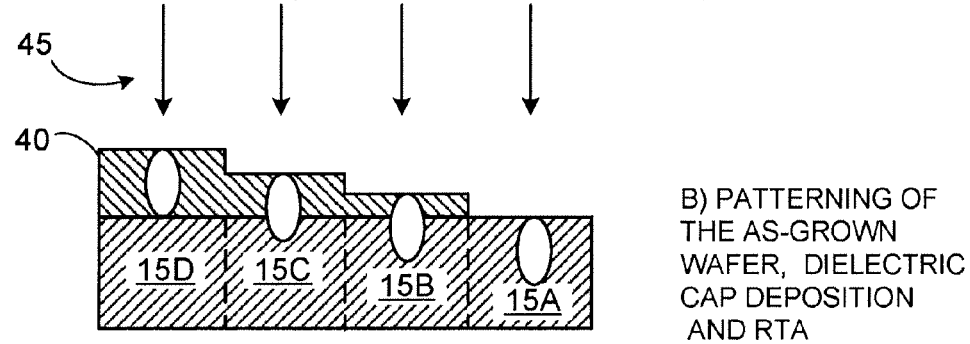
Figure 5C:
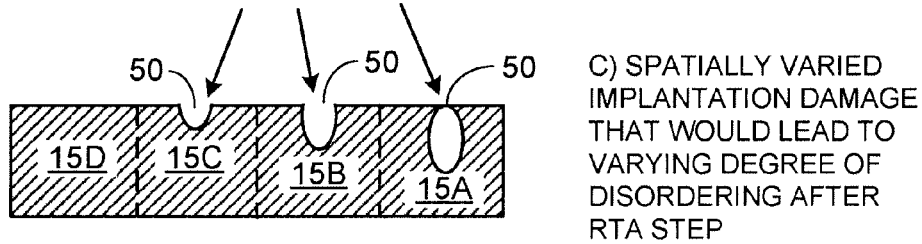

Referring now to FIGS. 5A-5C, there is shown another preferred embodiment of the present invention. More particularly, in FIGS. 5A-5C, there is shown an implantation mask 40 (FIG. 5A) used together with implantation flux 45 (FIG. 5B) to provide ion-implantation to supplement the bandgap shift provided by the rapid thermal annealing processes described hereinabove. For example, ion implantation is preferably used to introduce impurities or vacancies at varying heights in the semiconductor (comprising the quantum wells to be bandgap shifted) and thus after rapid thermal annealing (RTA), different amounts of bandgap shift occur at different locations. Ion implantation enhances disordering and bandgap shift, hence, it may also be used in place of dielectric material 20 as the instigator of disordering. The closer the implantation center of gravity is to the target quantum wells, the more that section is bound to disorder under rapid thermal annealing (RTA). Thus, by having different thicknesses of implantation mask 40, a spatially varying disordering and bandgap shift is produced.

Still referring to FIGS. 5A-5C, if the thickness of implantation mask 40 is chosen properly, some of implantation damage 50 may occur in mask 40 so as to reduce the total damage in semiconductor wafer 5.

In addition to the distance of the implantation effective center from the active region, the dosage of implantation flux 45 also affects the amount of disordering. Thus, by varying the dosage of implantation flux 45 across sections 15A, 15B, 15C, 15D of wafer 5, spatial disordering is provided.

Figure 6:
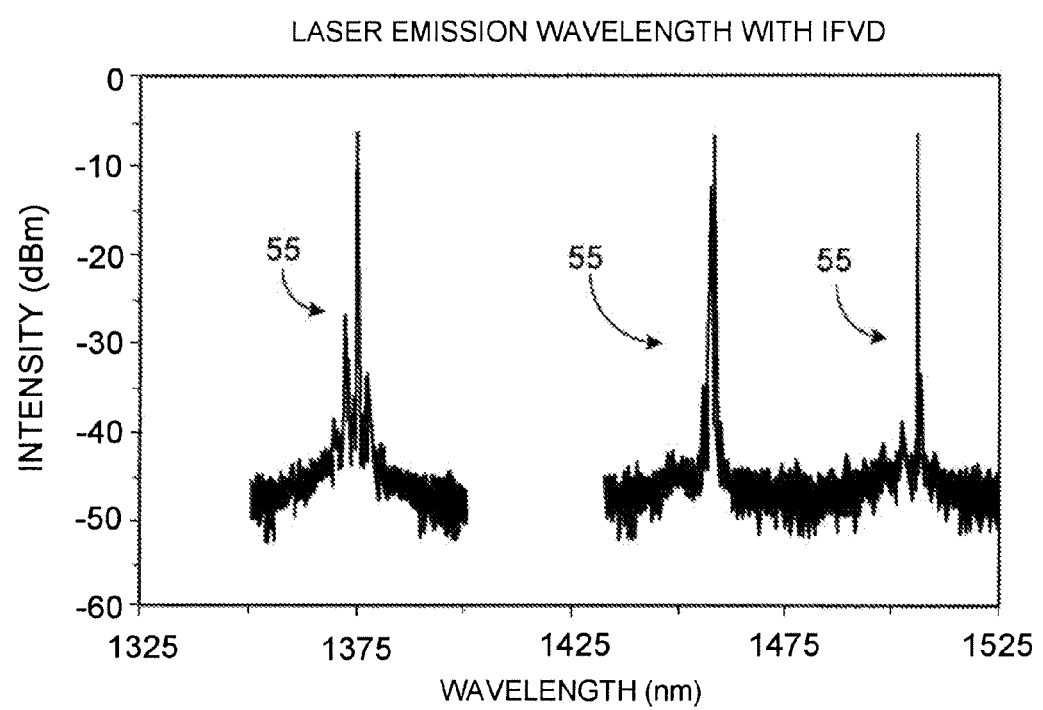
FIG. 6 is a graphical diagram in which there is shown photoluminescence shifts of 130 nm in laser emission, where the photoluminescent shifts are created by the impurity free vacancy disordering (IFVD) technique of FIG. 1.

Referring now to FIG. 6, there is shown laser wavelength emissions 55 formed by impurity free vacancy disordering (IFVD) demonstrating a bandgap tuning of 130 nm of emission wavelengths using the present invention.

Figure 7:
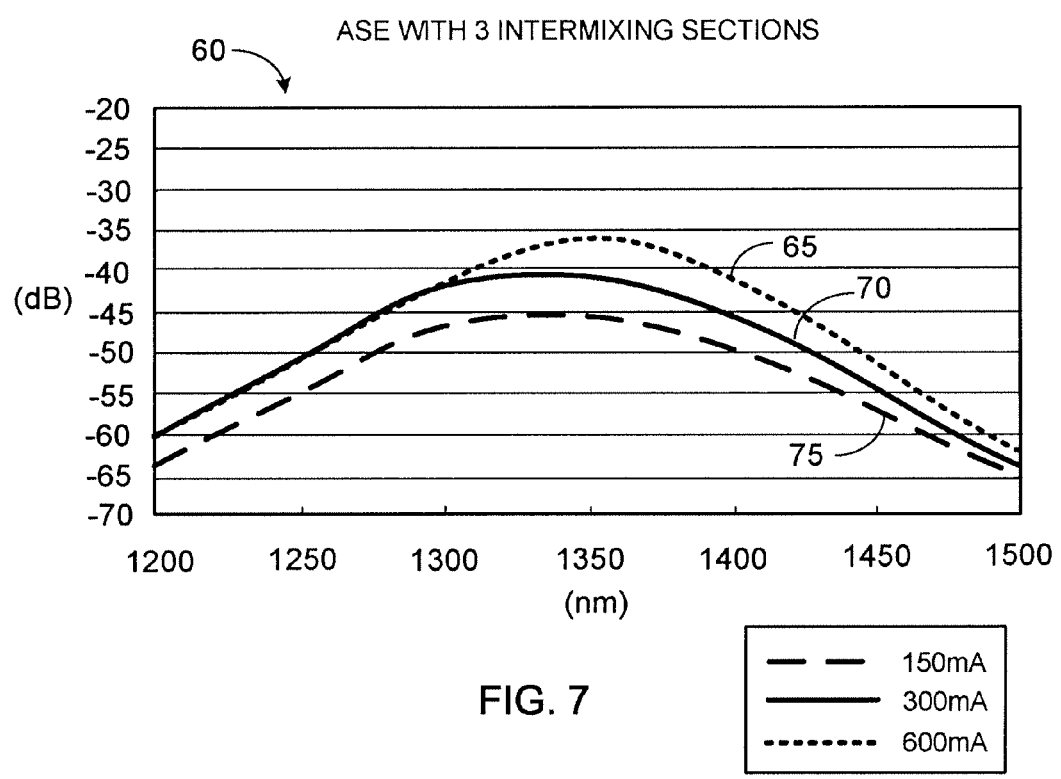
FIG. 7 is a graphical diagram in which there is shown an amplified spontaneous emission spectrum based on a silicon wafer formed with three impurity free vacancy disordered (IFVD) sections using the novel bandgap modification process of the present invention, such that the output of the light sources is broadened to a full-width half-maximum (FWHM) of 90 nm (as opposed to a conventional broadened output having a FWHM of 25 nm)

Referring now to FIG. 7, there is shown an amplified spontaneous emission spectrum 60 based on 3 impurity free vacancy disordering (IFVD) sections so as to effect the broadening of light sources 65, 70, 75 to full-width half-maximum (FWHM) of 90 nm as opposed to a conventional broadened output having a FWHM of 25 nm.

Figure 8:
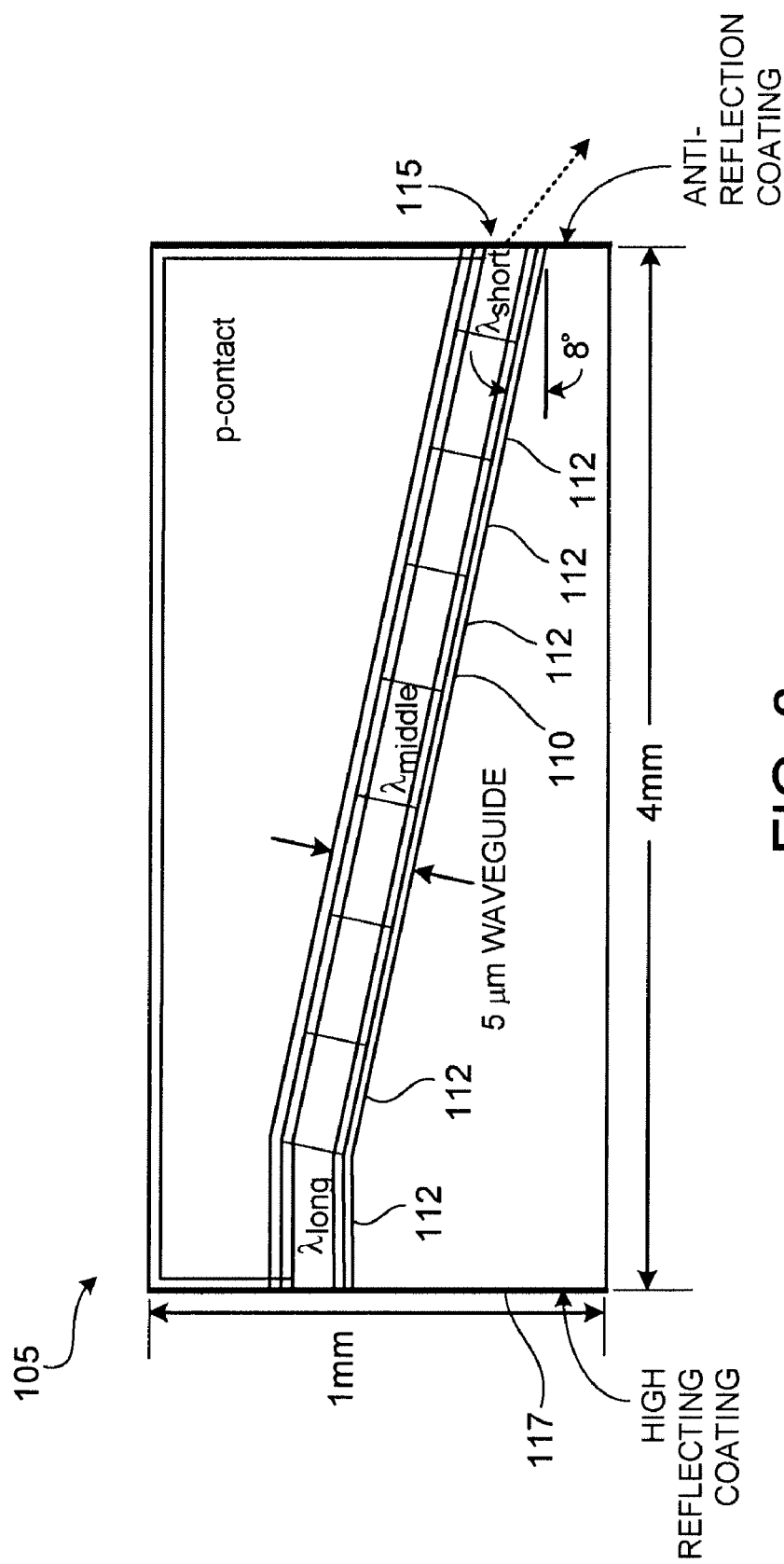
FIG. 8 is a schematic diagram of a semiconductor device formed in accordance with the present invention.

Looking next at FIG. 8, there is shown a laser 105 formed in accordance with the present invention. Laser 105 comprises a waveguide 110 with a plurality of distinct gain sections 112, a front mirror 115 and a rear mirror 117. The laser 105 is configured so that each of the distinct gain sections 112 can be individually excited so as to permit the output wavelength(s) of the laser to be controlled. Further details regarding laser 105 are disclosed in pending U.S. patent application Ser. No. 10/800,206, filed Mar. 12, 2004 by Daryoosh Vakhshoori et al. for EXTENDED OPTICAL BANDWIDTH SEMICONDUCTOR SOURCE, which patent application is hereby incorporated herein by reference. In accordance with the present invention, distinct gain sections 112 may be created by disordering-induced bandgap shifting of the quantum wells so as to provide the desired bandgap tuning and resulting photoluminescent shifts.

In the foregoing discussion of the invention, the desired bandgap shift is discussed in the context of placing a dielectric material above the quantum wells and then rapid thermal annealing (RTA) so as to induce the desired disordering and hence achieve the intended bandgap shift. However, it should also be appreciated that the invention can be practiced by substituting appropriate non-dielectric materials, such as semiconductors and metals, in place of the dielectric material.

What is claimed is:

1. A method for forming a semiconductor substrate, the method comprising:

providing a single semiconductor wafer having a first end and a second end in opposition to one another, a longitudinal axis formed between the first end and the second end, a top surface and a bottom surface in opposition to one another, a plurality of quantum wells disposed in the semiconductor wafer, and the plurality of quantum wells having a given bandgap;

depositing a first dielectric cap to entirely cover the top surface of the single semiconductor wafer the covered top surface defining a first given portion; and rapid thermal annealing the single semiconductor wafer and the first dielectric cap deposited on the top surface of the single semiconductor material so as to tune the plurality of quantum wells disposed in the semiconductor wafer beneath the first dielectric cap from the given bandgap to a first tuned bandgap;

wherein the first tuned bandgap is greater than the given bandgap;

wherein the top surface of the single semiconductor is entirely covered by the first given portion; and further comprising the steps of depositing a second dielectric cap on the top surface of the single semiconductor wafer subsequent to the step of rapid thermal annealing the first dielectric cap, the second dielectric cap configured to cover a second given portion of the top surface of the single semiconductor wafer, the second given portion having a smaller surface area than the first given portion, and rapid thermal annealing of the second dielectric cap deposited on the top surface the single semiconductor material to further tune the plurality of quantum wells disposed beneath the second dielectric cap from the first tuned bandgap to a second tuned bandgap, wherein the second tuned bandgap is greater than the first tuned bandgap.

2. A method according to claim 1 further comprising the steps of depositing a third dielectric cap on the top surface of the single semiconductor wafer subsequent to the step of rapid thermal annealing the second dielectric cap, the third dielectric cap configured to cover a third given portion of the top surface of the single semiconductor wafer, the third given portion configured within the second given portion, the third given portion having a smaller surface area than the second given portion, and rapid thermal annealing the third dielectric cap deposited on the top surface of the single semiconductor material to further tune the plurality of quantum walls disposed beneath the third dielectric cap from the second tuned bandgap to a third tuned bandgap, wherein the third tuned bandgap is greater than the second tuned bandgap.

3. A method according to claim 2 wherein the single semiconductor wafer comprises a first section, a second section, and a third section, the first section consisting of the plurality of quantum wells disposed beneath the first portion exclusive of the second portion, the second section consisting of the plurality of quantum wells disposed beneath the second portion exclusive of the third portion, and the third section consisting of the plurality of quantum wells disposed beneath the third portion, wherein the first section has the first tuned bandgap, the second section has the second tuned bandgap, and the third section has the third tuned bandgap.

4. A method for forming a semiconductor substrate, the method comprising:
providing a single semiconductor wafer having a first end and a second end in opposition to one another, a longitudinal axis formed between the first end and the second end, a top surface and a bottom surface in opposition to one another, a plurality of quantum wells disposed in the semiconductor wafer, and the plurality of quantum wells having a given bandgap;
depositing a first dielectric cap on a first given portion of the top surface of the single semiconductor wafer; and
rapid thermal annealing the single semiconductor wafer and the first dielectric cap deposited on the top surface of the single semiconductor material so as to tune the plurality of quantum wells disposed in the semiconductor wafer beneath the first dielectric cap from the given bandgap to a first tuned bandgap;
wherein the first tuned bandgap is greater than the given bandgap;
wherein the top surface of the single semiconductor wafer is partially covered by the first given portion so as to provide a given uncapped portion; and
further comprising the steps of depositing a second dielectric cap on the top surface of the single semiconductor wafer subsequent to the step of rapid thermal annealing the second dielectric cap, the second dielectric cap configured to cover a second given portion of the top surface of the single semiconductor wafer, the second given portion configured within the first given portion, the second given portion having a smaller surface area than the first given portion, and rapid thermal annealing the second dielectric cap deposited on the top surface of the single semiconductor material to further tune the plurality of quantum walls disposed beneath the second dielectric cap from the first tuned bandgap to a second tuned bandgap, wherein the second tuned bandgap is greater than the first tuned bandgap.

5. A method according to claim 4 further comprising the steps of depositing a third dielectric cap on the top surface of the single semiconductor wafer subsequent to the step of rapid thermal annealing the second dielectric cap, the third dielectric cap configured to cover a third given portion of the top surface of the single semiconductor wafer, the third given portion configured within the second given portion, the third given portion having a smaller surface area than the second given portion, and rapid thermal annealing the third dielectric cap deposited on the top surface of the single semiconductor material to further tune the plurality of quantum walls disposed beneath the third dielectric cap from the second tuned bandgap to a third tuned bandgap, wherein the third tuned bandgap is greater than the second tuned bandgap.

6. A method according to claim 5 wherein the single semiconductor wafer comprises a first section, a second section, a third section, and a fourth section, the first section consisting of the plurality of quantum wells disposed beneath the given uncapped portion, the second section consisting of the plurality of quantum wells disposed beneath the first portion exclusive of the second portion, the third section consisting of the plurality of quantum wells disposed beneath the second portion exclusive of the third portion, and the fourth section consisting of the plurality of quantum wells disposed beneath the third portion, wherein the first section comprises the given bandgap, the second section comprises the first tuned bandgap, the third section comprises the second tuned bandgap, and the fourth section comprises the third tuned bandgap.

* * * * *

UNITED STATES PATENT AND TRADEMARK OFFICE
CERTIFICATE OF CORRECTION

PATENT NO.        : 7,344,905 B2                                      Page 1 of 1
APPLICATION NO.   : 10/824838
DATED             : March 18, 2008
INVENTOR(S)       : Peidong Wang, Chih-Cheng Lu and Daryoosh Vakhshoori It is certified that error appears in the above-identified patent and that said Letters Patent is hereby corrected as shown below:

Column 1, Line 15, please insert:

--STATEMENT REGARDING FEDERALLY SPONSORED RESEARCH

This invention was made with Government support under Contract Number SB1341-03-W-0819 awarded by the United States Department of Commerce National Institute of Standards and Technology (NIST). The Government has certain rights in the invention.--

Signed and Sealed this

Twenty-fifth Day of November, 2008

JON W. DUDAS
*Director of the United States Patent and Trademark Office*